(12) United States Patent
Kim

(10) Patent No.: US 12,190,956 B2
(45) Date of Patent: Jan. 7, 2025

(54) MEMORY DEVICE AND METHOD OF OPERATING THE MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 88 days.

(21) Appl. No.: 17/720,998

(22) Filed: Apr. 14, 2022

(65) Prior Publication Data

US 2023/0018605 A1   Jan. 19, 2023

(30) Foreign Application Priority Data

Jul. 15, 2021 (KR) .................. 10-2021-0093055

(51) Int. Cl.
| | |
|---|---|
| G11C 16/08 | (2006.01) |
| G11C 16/10 | (2006.01) |
| G11C 16/28 | (2006.01) |
| G11C 16/34 | (2006.01) |

(52) U.S. Cl.
CPC ............ G11C 16/102 (2013.01); G11C 16/08 (2013.01); G11C 16/28 (2013.01); G11C 16/3404 (2013.01)

(58) Field of Classification Search
CPC ....... G11C 16/102; G11C 16/08; G11C 16/28; G11C 16/3404; G11C 11/5642; G11C 16/0483; G11C 16/26; G11C 16/32; G11C 16/3427; G11C 16/10; G11C 16/24; G11C 16/3418; G11C 16/3459

USPC ......................................................... 365/203
See application file for complete search history.

(56) References Cited

U.S. PATENT DOCUMENTS

| | | | | |
|---|---|---|---|---|
| 2016/0343414 | A1* | 11/2016 | Lee | G11C 16/3427 |
| 2017/0154680 | A1* | 6/2017 | Lee | G11C 16/0483 |
| 2018/0033492 | A1* | 2/2018 | Seo | G11C 16/08 |

FOREIGN PATENT DOCUMENTS

| | | | | | |
|---|---|---|---|---|---|
| KR | 20090069888 | A | * | 7/2009 | G11C 16/30 |
| KR | 20120098080 | A | * | 9/2012 | G11C 8/08 |
| KR | 101678907 | B1 | | 11/2016 | |
| KR | 101784973 | B1 | | 10/2017 | |
| KR | 20180065268 | A | * | 6/2018 | G11C 16/08 |

* cited by examiner

*Primary Examiner* — Huan Hoang
(74) *Attorney, Agent, or Firm* — WILLIAM PARK & ASSOCIATES LTD.

(57) ABSTRACT

A memory device including a plurality of memory cells, a peripheral circuit configured to perform a read operation of reading data from memory cells connected to a selected word line, and a read operation controller configured to apply a plurality of read voltages to the selected word line, apply a first pass voltage to unselected word lines while first read voltages for determining a program state of memory cells having a threshold voltage higher than a reference voltage among the plurality of read voltages are applied to the selected word line, and apply a second pass voltage higher than the first pass voltage to the unselected word line while second read voltages for determining a program state of memory cells having a threshold voltage lower than the reference voltage among the plurality of read voltages are applied to the selected word line.

9 Claims, 16 Drawing Sheets

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2021-0093055, filed on Jul. 15, 2021, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. The storage device may include a memory device storing data and a memory controller controlling the memory device. The memory device may be classified into a volatile memory device and a nonvolatile memory device.

The volatile memory device may be a device that stores data only when power is supplied and loses the stored data when the power supply is cut off. The volatile memory device may include a static random access memory (SRAM), a dynamic random access memory (DRAM), and the like.

The nonvolatile memory device is a device that does not lose data even though power is cut off. The nonvolatile memory device includes a read only memory (ROM), a programmable ROM (PROM), an electrically programmable ROM (EPROM), an electrically erasable and programmable ROM (EEPROM), a flash memory, and the like.

SUMMARY

According to an embodiment of the present disclosure, a memory device may include a plurality of memory cells connected to a plurality of word lines, a peripheral circuit configured to perform a read operation of reading data from memory cells among the plurality of memory cells, the memory cells connected to a selected word line among the plurality of word lines, and a read operation controller configured to control the peripheral circuit to apply a plurality of read voltages to the selected word line, apply a first pass voltage to unselected word lines except for the selected word line among the plurality of word lines while first read voltages for determining a program state of memory cells having a threshold voltage higher than a reference voltage among the plurality of read voltages are applied to the selected word line, and apply a second pass voltage higher than the first pass voltage to the unselected word lines while second read voltages for determining a program state of memory cells having a threshold voltage lower than the reference voltage among the plurality of read voltages are applied to the selected word line.

According to an embodiment of the present disclosure, a method of operating a memory device may include applying a first read voltage among a plurality of read voltages to a selected word line, applying a first pass voltage to unselected word lines, applying a second read voltage different from the first read voltage among the plurality of read voltages to the selected word line, and applying a second pass voltage higher than the first pass voltage to the unselected word lines.

According to an embodiment of the present disclosure, a method of operating a memory device may include applying any one of a plurality of read voltages to a selected word line, applying a first pass voltage to unselected word lines while a first read voltage for determining a program state of memory cells having a threshold voltage higher than a reference voltage among the plurality of read voltages is applied to the selected word line, and applying a second pass voltage higher than the first pass voltage to the unselected word lines while a second read voltage for determining a program state of memory cells having a threshold voltage lower than the reference voltage among the plurality of read voltages is applied to the selected word line.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

It will be understood that although the terms first, second, third etc. may be used herein to describe various elements, these elements should not be limited by these terms. These terms are only used to distinguish one element from another element, but not used to define only the element itself or to mean a particular sequence.

An embodiment of the present disclosure provides a memory device capable of improving read disturbance, and a method of operating the memory device.

According to an embodiment, a memory device capable of improving read disturbance, and a method of operating the memory device are provided.

Figure 1:
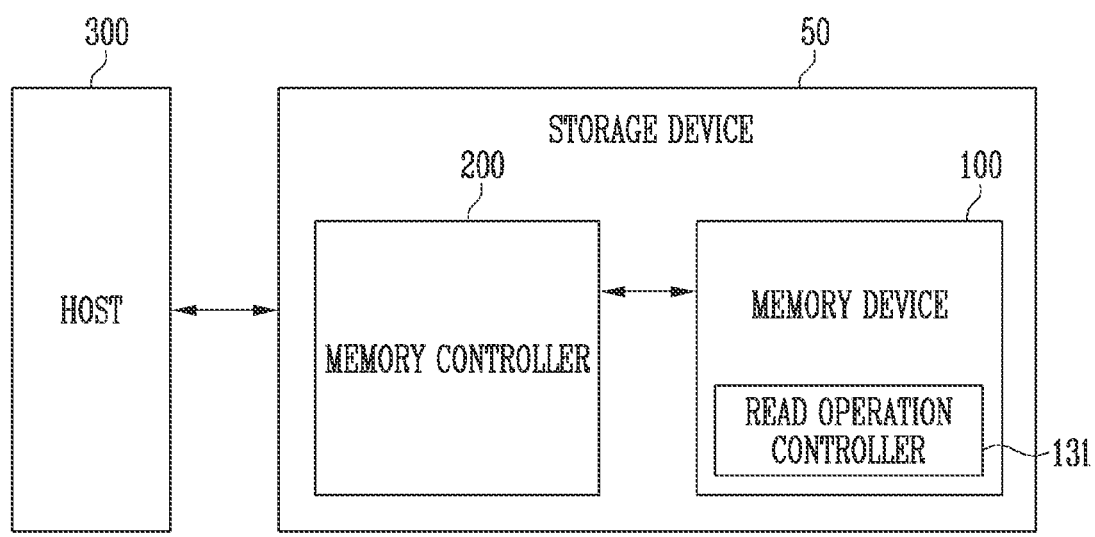
FIG. 1 is a diagram illustrating a storage device according to an embodiment of the present disclosure.

FIG. 1 is a diagram illustrating a storage device according to an embodiment of the present disclosure.

Referring to FIG. 1, the storage device 50 may include a memory device 100 and a memory controller 200 that controls an operation of the memory device. The storage device 50 may be a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates under control of the memory controller 200. The memory device 100 may include a memory cell array (not shown) including a plurality of memory cells that store data.

Each of the memory cells may be configured as a single level cell (SLC) that stores one data bit, a multi-level cell (MLC) that stores two data bits, a triple level cell (TLC) that stores three data bits, or a quad level cell (QLC) capable of storing four data bits.

The memory cell array (not shown) may include a plurality of memory blocks. Each memory block may include a plurality of memory cells. One memory block may include a plurality of pages. In an embodiment, the page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command CMD and an address ADDR from the memory controller 200 and access an area selected by the address in the memory cell array. The memory device 100 may perform an operation instructed by the command CMD on the area selected by the address ADDR. For example, the memory device 100 may perform a write operation (program operation), a read operation, and an erase operation. During the program operation, the memory device 100 may program data to the area selected by the address ADDR. During the read operation, the memory device 100 may read data from the area selected by the address ADDR. During the erase operation, the memory device 100 may erase data stored in the area selected by the address ADDR.

In an embodiment, the memory device 100 may include a read operation controller 131.

The read operation controller 131 may control the read operation of the memory device 100.

For example, the read operation controller 131 may control the memory device 100 to apply a plurality of read voltages to a selected word line. In addition, the read operation controller 131 may control the memory device 100 to apply a pass voltage to an unselected word line while the read voltage is applied to a selected word line.

Meanwhile, in a memory block formed in a three-dimensional structure, since memory cells are stacked in a Z direction along a vertical channel, in order to increase an integration degree of the memory device 100, a space between the memory cells is required to be reduced. In a memory block formed in a three-dimensional structure, since memory cells may be formed in a vertical channel that is in contact with word lines, the integration degree of the memory device 100 may increase as the distance between word lines spaced apart from each other decreases. However, when the distance between the word lines is decreased, since a distance between the memory cells is decreased simultaneously, an interference phenomenon may occur between the memory cells during the read operation. In this case, a threshold voltage distribution of the memory cells may be deteriorated. Therefore, the memory device 100 may improve deterioration due to the interference phenomenon by increasing the pass voltage applied to the unselected word line during the read operation. However, when the pass voltage applied to the unselected word line is increased, a read disturbance phenomenon occurs.

Therefore, according to an embodiment of the present disclosure, the read disturbance phenomenon may be improved, by applying any one of a plurality of pass voltages to the unselected word line according to the read voltage applied to the selected word line.

The memory controller 200 may control an overall operation of the storage device 50.

When power is applied to the storage device 50, the memory controller 200 may execute firmware (FW). When the memory device 100 is a flash memory device, the firmware (FW) may include a host interface layer (HIL) that controls communication with the host 300. The memory controller 200 may include a flash translation layer (FTL) that controls communication between the host 300 and the memory device 100, and a flash interface layer (FIL) that controls communication with the memory device 100.

In an embodiment, the memory controller 200 may receive data and a logical block address (LBA) from the host 300 and may convert the LBA into a physical block address (PBA) indicating an address of memory cells in which data included in the memory device 100 is to be stored. In the present specification, the LBA and a "logic address" or a "logical address" may be used as the same meaning. In the present specification, the PBA and a "physical address" may be used as the same meaning.

The memory controller 200 may control the memory device 100 to perform the program operation, the read operation, the erase operation, or the like according to a request of the host 300. During the program operation, the memory controller 200 may provide a write command, the PBA, and data to the memory device 100. During the read operation, the memory controller 200 may provide a read command and the PBA to the memory device 100. During the erase operation, the memory controller 200 may provide an erase command and the PBA to the memory device 100.

In an embodiment, the memory controller 200 may be connected to the memory device 100 through a channel. For example, the memory controller 200 may control the memory device 100 to perform a program operation, a read operation, an erase operation, or the like, by providing a command and an address to the memory device 100 through the channel.

In an embodiment, the memory controller 200 may generate a command, an address, and data independently regardless of the request from the host 300 and transmit the command, the address, and the data to the memory device 100. For example, the memory controller 200 may provide the command, the address, and the data for performing a read operation and program operations accompanying in performing wear leveling, read reclaim, garbage collection, and the like, to the memory device 100.

In an embodiment, the memory controller 200 may control at least two or more memory devices 100. In this case, the memory controller 200 may control the memory devices 100 according to an interleaving method to improve operation performance. The interleaving method may be a method of controlling operations for at least two memory devices 100 to overlap with each other.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
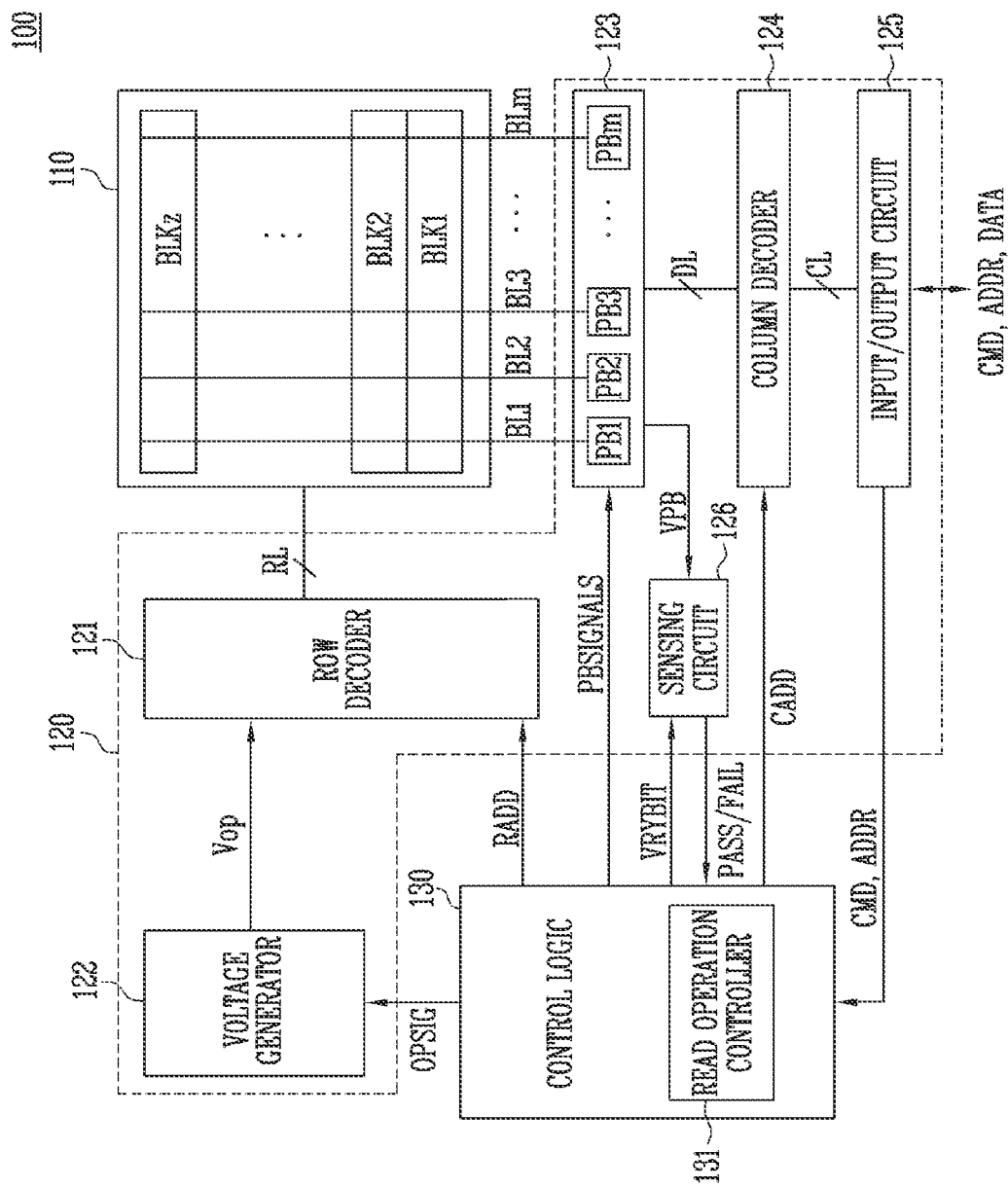
FIG. 2 is diagram illustrating a memory device of FIG. 1.

FIG. 2 is diagram illustrating the memory device 100 of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLm. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on a selected region of the memory cell array 110 under control of the control logic 130. The peripheral circuit 120 may drive the memory cell array 110. For example, the peripheral circuit 120 may apply various operation voltages to the row lines RL and the bit lines BL1 to BLm or discharge the applied voltages under the control of the control logic 130.

The peripheral circuit 120 may include a row decoder 121, a voltage generator 122, the page buffer group 123, a column decoder 124, and an input/output circuit 125.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to operate in response to control of the control logic 130. The row decoder 121 receives a row address RADD from the control logic 130.

The row decoder 121 is configured to decode the row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. Specifically, the voltage generator 122 may generate various operation voltages Vop used for the program, read, and erase operations, in response to an operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to m-th page buffers PB1 to PBm. The first to m-th page buffers PB1 to PBm are connected to the memory cell array 110 through the first to m-th bit lines BL1 to BLm, respectively. The first to m-th page buffers PB1 to PBm operate in response to the control of the control logic 130. Specifically, the first to m-th page buffers PB1 to PBm may operate in response to page buffer control signals PBSIGNALS. For example, the first to m-th page buffers PB1 to PBm may temporarily store data received through the first to m-th bit lines BL1 to BLm, or may sense a voltage or a current of the bit lines BL1 to BLm during the read or verify operation.

Specifically, during the program operation, when the program pulse is applied to the selected word line, the first to m-th page buffers PB1 to PBm may transfer data DATA received through the input/output circuit 125 to the selected memory cells through the first to m-th bit lines BL1 to BLm. The memory cells of the selected page are programmed according to the transferred data DATA. The memory cell connected to the bit line to which a program allowable voltage (for example, a ground voltage) is applied may have an increased threshold voltage. The threshold voltage of the memory cell connected to the bit line to which a program inhibit voltage (for example, a power voltage) is applied may be maintained. During the program verify operation, the first to m-th page buffers PB1 to PBm read page data from the selected memory cells through the first to m-th bit lines BL1 to BLm.

During the read operation, the first to m-th page buffers PB1 to PBm read the data DATA from the memory cells of the selected page through the first to m-th bit lines BL1 to BLm, and outputs the read data DATA to the input/output circuit 125 under control of the column decoder 124.

During the erase operation, the first to m-th page buffers PB1 to PBm may float the first to m-th bit lines BL1 to BLm.

The column decoder 124 may transfer data between the input/output circuit 125 and the page buffer group 123 in response to a column address CADD. For example, the column decoder 124 may exchange data with the first to m-th page buffers PB1 to PBm through data lines DL, or may exchange data with the input/output circuit 125 through column lines CL.

The input/output circuit 125 may transfer the command CMD and the address ADDR received from the memory controller 200 described with reference to FIG. 1 to the control logic 130, or may exchange data DATA with the column decoder 124.

The sensing circuit 126 may generate a reference current in response to an allowable bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the allowable bit VRYBIT in response to the command CMD and the address ADDR to control the peripheral circuits 120. In addition, the control logic 130 may determine whether the verify operation is passed or failed in response to the pass signal PASS or the fail signal FAIL.

In an embodiment, the control logic 130 may include the read operation controller 131 described with reference to FIG. 1.

The read operation controller 131 may control the peripheral circuit 120 to perform the read operation. For example, the read operation controller 131 may control the peripheral circuit to apply a plurality of read voltages to the selected word line. At this time, the plurality of read voltages may be read voltages for distinguishing a plurality of program states divided based on a threshold voltage.

In an embodiment, the read operation controller 131 may control the peripheral circuit 120 to apply any one of the plurality of pass voltages to the unselected word lines according to the read voltage applied to the selected word line.

For example, the read operation controller 131 may control the peripheral circuit 120 to apply a first pass voltage to the unselected word lines while applying first read voltages among the plurality of read voltages to the selected word line. At this time, the first read voltages may be read voltages for determining a program state of memory cells having a threshold voltage higher than the reference voltage.

In addition, the read operation controller 131 may control the peripheral circuit 120 to apply a second pass voltage higher than the first pass voltage to the unselected word line while applying second read voltages among the plurality of read voltages to the selected word line. At this time, the second read voltages may be read voltages for determining a program state of memory cells having a threshold voltage lower than the reference voltage. In this case, the first read voltages may be higher than the second read voltages.

In an embodiment, the reference voltage may be a voltage that becomes a reference for dividing the plurality of program states into two groups. For example, the reference voltage may be a voltage for dividing the plurality of program states into upper program states and lower program states. At this time, the upper program states may be program states having the threshold voltage higher than the reference voltage. The lower program states may be program states having the threshold voltage lower than the reference voltage.

In an embodiment, the reference voltage may be a read voltage having an intermediate magnitude among the plurality of read voltages. The intermediate magnitude may be a value greater than the smallest value among the plurality of read voltages and smaller than the largest value among the plurality read voltages. For example, when the plurality of read voltages comprise 5V, 10V and 15V, then the intermediate magnitude may be 10V. In another embodiment, the reference voltage may be a read voltage having the smallest magnitude among the plurality of read voltages. However, differently from the above-described example, the reference voltage may be variously set according to an embodiment.

Figure 3:
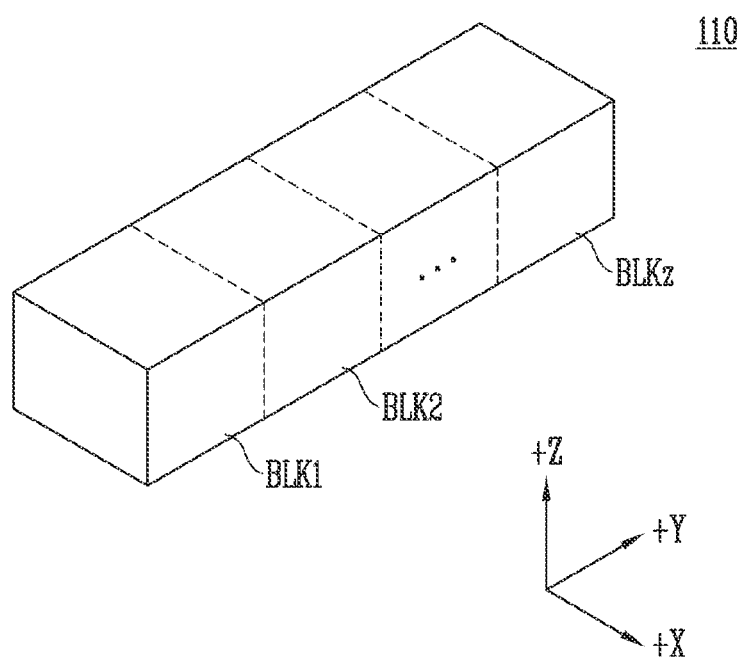
FIG. 3 is a diagram illustrating an embodiment of a memory cell array of FIG. 2.

FIG. 3 is a diagram illustrating an embodiment of the memory cell array of FIG. 2.

Referring to FIG. 3, the memory cell array 110 includes a plurality of memory blocks BLK1 to BLKz. Each memory block may have a three-dimensional structure. Each memory block includes a plurality of memory cells stacked on a substrate. Such plurality of memory cells are arranged along a +X direction, a +Y direction, and a +Z direction. A structure of each memory block is described with reference to FIGS. 4 and 5.

Figure 4:
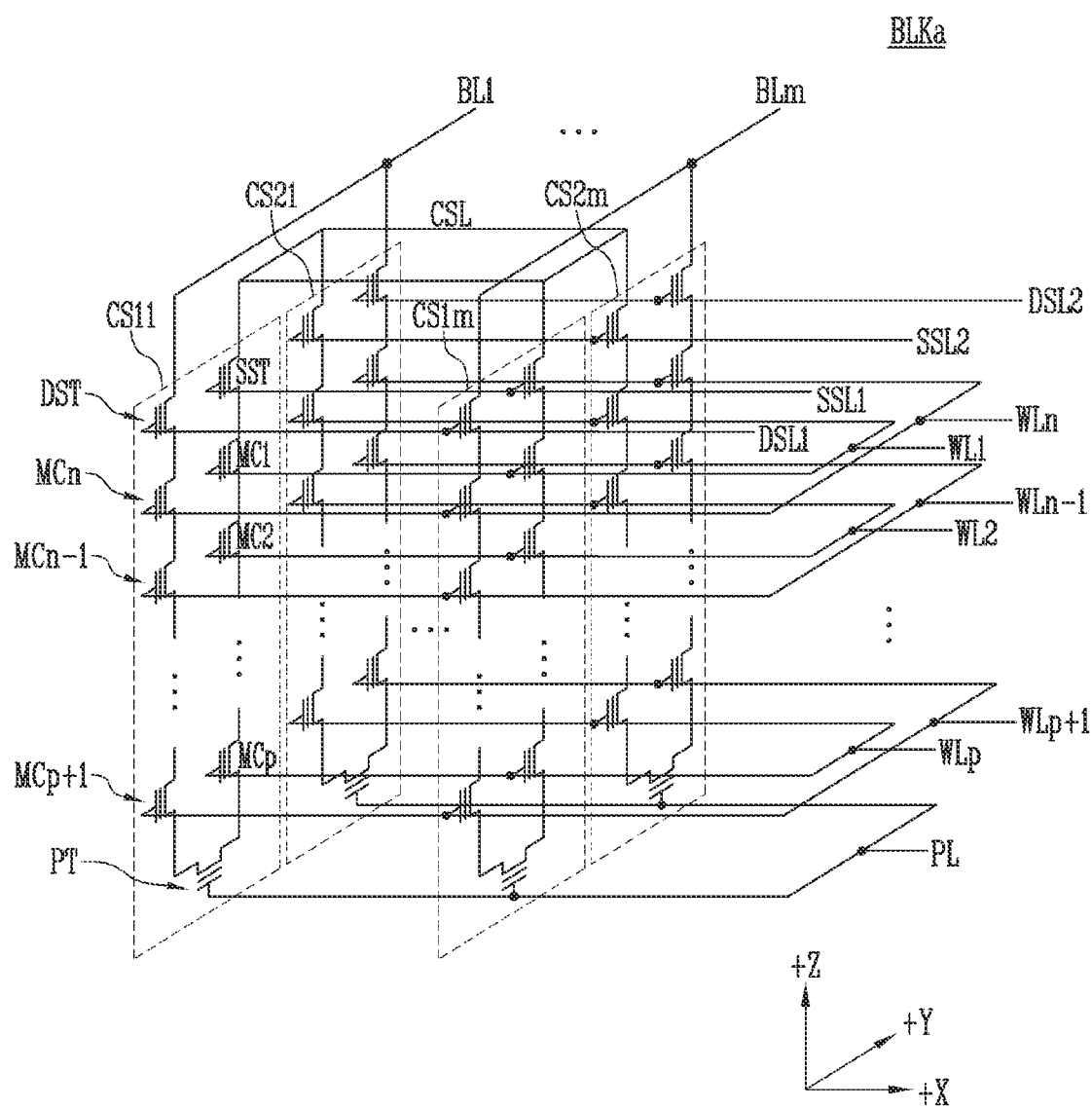
FIG. 4 is a circuit diagram illustrating any one memory block among memory blocks of FIG. 3.

FIG. 4 is a circuit diagram illustrating any one memory block BLKa among the memory blocks BLK1 to BLKz of FIG. 3.

Referring to FIG. 4, the memory block BLKa includes a plurality of memory cell strings CS11 to CS1m and CS21 to CS2m. As an embodiment, each of the plurality of memory cell strings CS11 to CS1m and CS21 to CS2m may be formed in a 'U' shape. In the memory block BLKa, m memory cell strings are arranged in a row direction (that is, the +X direction). In FIG. 4, two memory cell strings are arranged in a column direction (that is, the +Y direction). However, this is for convenience of description and it may be understood that three or more memory cell strings may be arranged in the column direction.

Each of the plurality of memory cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each memory cell string. As an embodiment, a pillar for providing at least one of the channel layer, the tunneling insulating film, the charge storage film, and the blocking insulating film may be provided in each memory cell string.

The source select transistor SST of each memory cell string is connected between a common source line CSL and the memory cells MC1 to MCp.

As an embodiment, the source select transistors of the memory cell strings arranged in the same row are connected to a source select line extending in the row direction, and the source select transistors of the memory cell strings arranged in different rows are connected to different source select lines. In FIG. 4, the source select transistors of the memory cell strings CS11 to CS1m of a first row are connected to a first source select line SSL1. The source select transistors of the memory cell strings CS21 to CS2m of a second row are connected to a second source select line SSL2.

As another embodiment, the source select transistors of the memory cell strings CS11 to CS1m and CS21 to CS2m may be commonly connected to one source select line.

The first to n-th memory cells MC1 to MCn of each memory cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each memory cell string are connected to the first to n-th word lines WL1 to WLn, respectively.

A gate of the pipe transistor PT of each memory cell string is connected to a pipeline PL.

The drain select transistor DST of each memory cell string is connected between a corresponding bit line and the memory cells MCp+1 to MCn. The drain select transistors DST of the memory cell strings arranged in the row direction are connected to the drain select line extending in the row direction. The drain select transistors of the memory cell strings CS11 to CS1m of the first row are connected to a first drain select line DSL1. The drain select transistors of the memory cell strings CS21 to CS2m of the second row are connected to a second drain select line DSL2.

The cell strings arranged in the column direction are connected to the bit lines extending in the column direction. In FIG. 4, the memory cell strings CS11 and CS21 of the first column are connected to the first bit line BL1. The memory cell strings CS1m and CS2m of the m-th column are connected to the m-th bit line BLm.

The memory cells connected to the same word line in the memory cell strings arranged in the row direction configure one page. For example, the memory cells connected to the first word line WL1, among the memory cell strings CS11 to CS1m of the first row configure one page. The memory cells connected to the first word line WL1, among the memory cell strings CS21 to CS2m of the second row configure another page. The memory cell strings arranged in one row direction may be selected by selecting any one of the drain select lines DSL1 and DSL2. One page of the selected memory cell strings may be selected by selecting any one of the word lines WL1 to WLn.

As another embodiment, even bit lines and odd bit lines may be provided instead of the first to m-th bit lines BL1 to BLm. In addition, even-numbered memory cell strings among the memory cell strings CS11 to CS1m or CS21 to SC2m arranged in the row direction may be connected to the even bit lines, respectively, and odd-numbered memory cell strings among the memory cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation on the memory block BLKa is improved, however, the size of the memory block BLKa increases. As less memory cells are provided, the size of the memory block BLKa may be reduced, however, the reliability of the operation on the memory block BLKa may be reduced.

In order to efficiently control at least one dummy memory cell, each of the dummy memory cells may have a required threshold voltage. Before or after an erase operation on the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
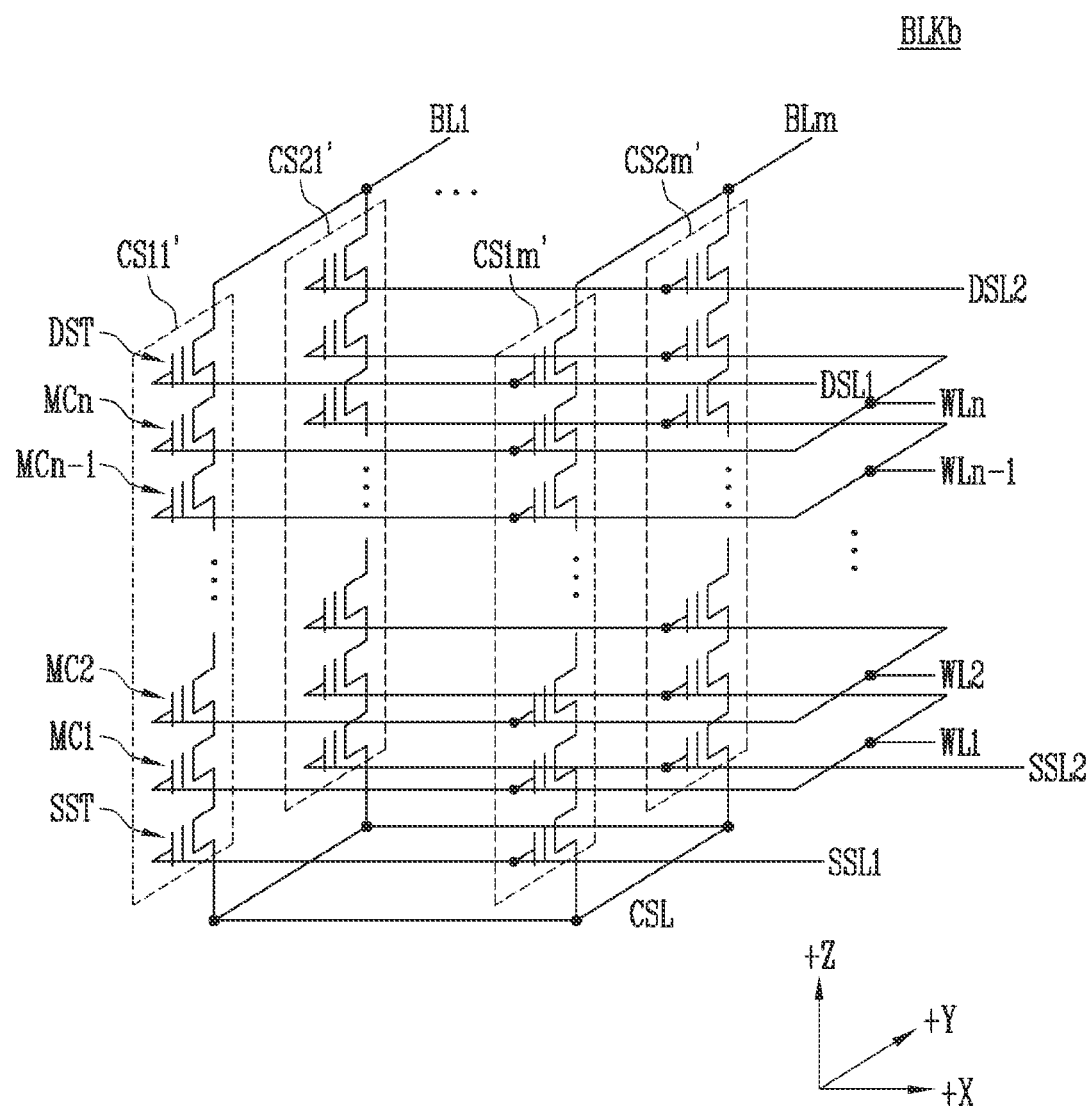
FIG. 5 is a circuit diagram illustrating another embodiment of any one memory block among the memory blocks of FIG. 3.

FIG. 5 is a circuit diagram illustrating another embodiment of any one memory block BLKb among the memory blocks BLK1 to BLKz of FIG. 3.

Referring to FIG. 5, the memory block BLKb includes a plurality of memory cell strings CS11' to CS1m' and CS21' to CS2m'. Each of the plurality of memory cell strings CS11' to CS1m' and CS21' to CS2m' extends along a +Z direction. Each of the plurality of memory cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

The source select transistor SST of each memory cell string is connected between a common source line CSL and memory cells MC1 to MCn. The source select transistors of the memory cell strings arranged in the same row are connected to the same source select line. The source select transistors of the memory cell strings CS11' to CS1m' arranged in a first row are connected to a first source select line SSL1. The source select transistors of the memory cell strings CS21' to CS2m' arranged in a second row are connected to a second source select line SSL2. As another embodiment, the source select transistors of the memory cell strings CS11' to CS1m' and CS21' to CS2m' may be commonly connected to one source select line.

The first to n-th memory cells MC1 to MCn of each memory cell string are connected in series between the source select transistor SST and the drain select transistor DST. Gates of the first to n-th memory cells MC1 to MCn are connected to first to the n-th word lines WL1 to WLn, respectively.

The drain select transistor DST of each memory cell string is connected between a corresponding bit line and the memory cells MC1 to MCn. The drain select transistors of the memory cell strings arranged in the row direction are connected to a drain select line extending in the row direction. The drain select transistors of the memory cell strings CS11' to CS1m' of a first row are connected to a first drain select line DSL1. The drain select transistors of the memory cell strings CS21' to CS2m' of a second row are connected to a second drain select line DSL2.

As a result, the memory block BLKb of FIG. 5 has an equivalent circuit similar to that of the memory block BLKa of FIG. 4 except that the pipe transistor PT is excluded from each memory cell string.

As another embodiment, even bit lines and odd bit lines may be provided instead of the first to m-th bit lines BL1 to BLm. In addition, even-numbered memory cell strings among the memory cell strings CS11' to CS1m' or CS21' to CS2m' arranged in the row direction may be connected to even bit lines, and odd-numbered memory cell strings among the memory cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation on the memory block BLKb is improved, however, the size of the memory block BLKb increases. As less memory cells are provided, the size of the memory block BLKb may be reduced, however, the reliability of the operation on the memory block BLKb may be reduced.

In order to efficiently control at least one dummy memory cell, each of the dummy memory cells may have a required threshold voltage. Before or after an erase operation on the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
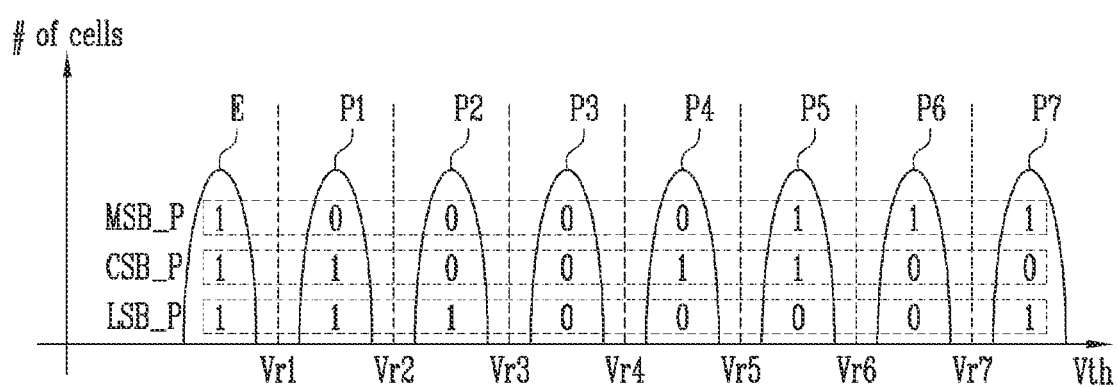
FIG. 6 is a diagram illustrating a threshold voltage distribution of memory cells.

FIG. 6 is a diagram illustrating a threshold voltage distribution of the memory cells.

In an embodiment of the present disclosure, a threshold voltage distribution of memory cells programmed in a TLC method is described as an example.

Referring to FIG. 6, a horizontal axis indicates a threshold voltage of a memory cell, and a vertical axis indicates the number of memory cells.

Selected memory cells, which are memory cells connected to the selected word line, may have a threshold voltage distribution corresponding to an erase state E before the program operation is performed.

When the memory cell stores data corresponding to three bits, the memory cell may be programmed to have a threshold voltage corresponding to any one of the erase state E, a first program state P1, a second program state P2, a third program state P3, a fourth program state P4, a fifth program state P5, a sixth program state P6, and a seventh program state P7.

The erase state E may correspond to data '111', the first program state P1 may correspond to data '011', the second program state P2 may correspond to data '001', the third program state P3 may correspond to data '000', the fourth program state P4 may correspond to data '010', the fifth program state P5 may correspond to data '110', the sixth program state P6 may correspond to data '100', and the seventh program state P7 may correspond to data '101'. However, the data corresponding to each program state is only an example and may be variously modified.

Memory cells connected to one word line may be defined as one physical page, and memory cells included in one physical page may store first to third logical page data. For example, the first logical page data may be data stored in an least significant bit (LSB) page LSB_P, the second logical page data may be data stored in a center significant bit (CSB) page CSB_P, and the third logical page data may be data stored in a most significant bit (MSB) page MSB_P.

When the program operation is ended, the selected memory cells may have the threshold voltage corresponding to any one of the erase state E, the first program state P1, the second program state P2, the third program state P3, the fourth program state P4, the fifth program state P5, the sixth program state P6, and the seventh program state P7. The memory device 100 may read data stored in the selected memory cells by performing a read operation using first to seventh read voltages Vr1 to Vr7.

The first read voltage Vr1 may be a read voltage that distinguishes between the erase state E and the first program state P1, the second read voltage Vr2 may be a read voltage that distinguishes between the first program state P1 and the second program state P2, the third read voltage Vr3 may be a read voltage that distinguishes between the second program state P2 and the third program state P3, the fourth read voltage Vr4 may be a read voltage that distinguishes between the third program state P3 and the fourth program state P4, the fifth read voltage Vr5 may be a read voltage that distinguishes between the fourth program state P4 and the fifth program state P5, the sixth read voltage Vr6 may be a read voltage that distinguishes between the fifth program state P5 and the sixth program state P6, and the seventh read voltage Vr7 may be a read voltage that distinguishes between the sixth program state P6 and the seventh program state P7.

Figure 7:
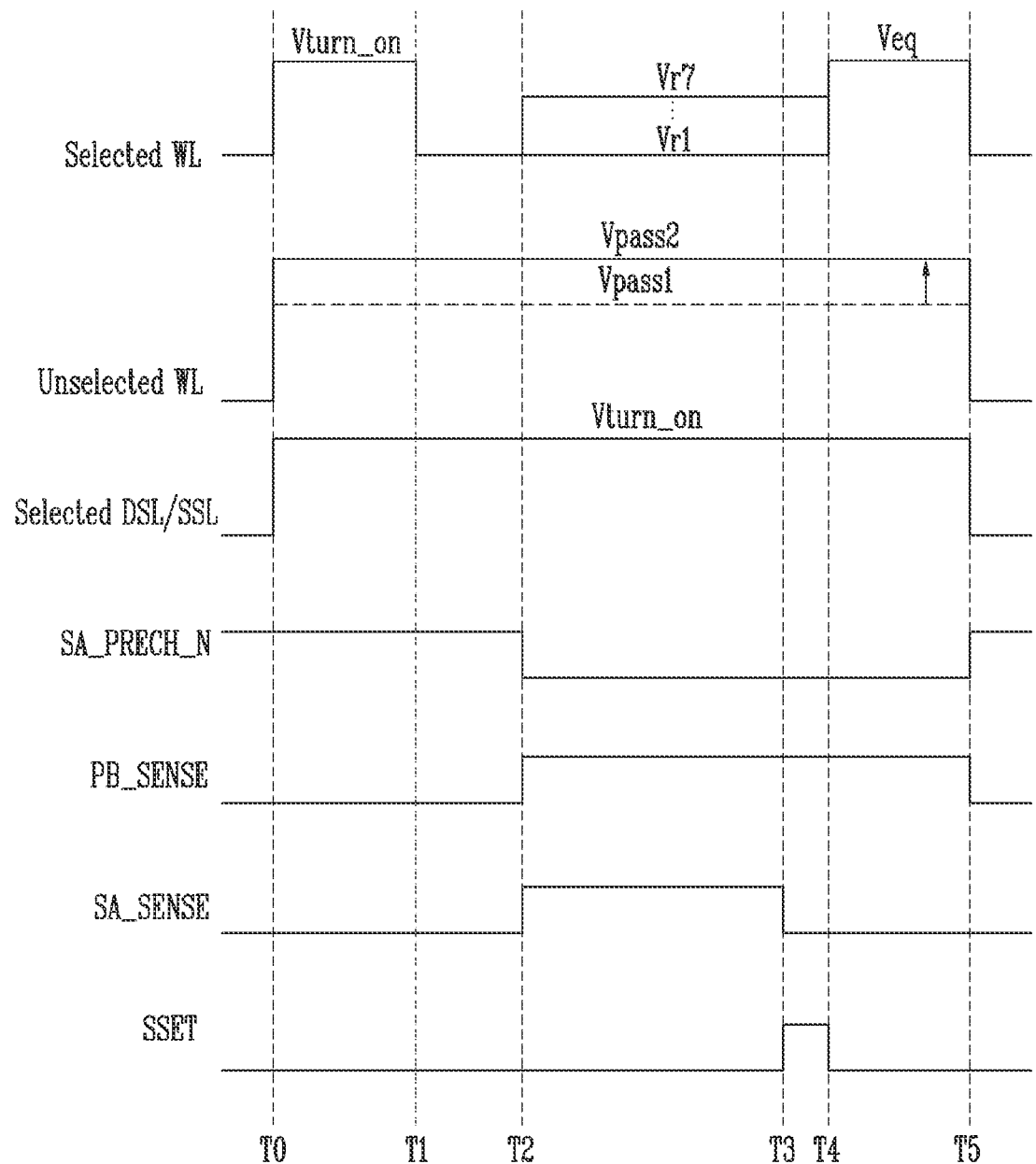
FIG. 7 is a waveform diagram illustrating a read disturbance phenomenon.

FIG. 7 is a waveform diagram illustrating a read disturbance phenomenon.

Referring to FIG. 7, a period T0 to T2 may be a channel precharge period.

At T0, a turn-on voltage Vturn_on may be applied to a selected word line Selected WL, a selected drain select line Selected DSL, and a selected source select line Selected SSL. In addition, a first pass voltage Vpass1 may be applied to an unselected word line Unselected WL. Accordingly, the source select transistor, the plurality of memory cells, and the drain select transistor of the selected memory block may be turned on. In addition, a channel of the selected memory block may be electrically connected to a source line of a ground voltage level, and thus hot holes in the channel of the selected memory block may be removed.

In addition, a sensing node precharge signal SA_P-RECH_N may have a high level, a page buffer sensing signal PB_SENSE may have a low level, a sensing signal SA_SENSE may have a low level, and a sub-setup signal SSET may have a low level.

At T1, as an embodiment, a ground voltage may be applied to the selected word line Selected WL. As another embodiment, a voltage different from the ground voltage may be applied to the selected word line.

A period T2 to T5 may be a read operation period.

At T2, any one of the plurality of read voltages Vr1 to Vr7 may be applied to the selected word line. The turn-on voltage Vturn_on may be maintained at the selected drain select line Selected DSL and the selected source select line Selected SSL. In addition, the first pass voltage Vpass1 may be maintained at the unselected word line Unselected WL.

In addition, the sensing node precharge signal SA_P-RECH_N may be changed to a low level, the page buffer sensing signal PB_SENSE may be changed to a high level, and the sensing signal SA_SENSE may be changed to a high level. Accordingly, a current may be sensed from the selected memory cells connected to the selected word line Selected WL.

At T3, the sensing signal SA_SENSE may be changed to a low level, and the sub-setup signal SSET may be changed to a high level. Accordingly, data read from the selected memory cells may be stored in a latch.

At T4, an equalizing voltage Veq may be applied to the selected word line Selected WL. The equalizing voltage Veq may have the same potential level as the first pass voltage Vpass1. Accordingly, the selected word line Selected WL and the unselected word lines Unselected WL may be discharged at the same potential level and may be discharged during the same discharge time and may be discharged to the same level.

In addition, the sub-setup signal SSET may be changed to a low level.

At T5, the selected word line Selected WL and the unselected word lines Unselected WL may be discharged.

Meanwhile, the first pass voltage Vpass1 may be maintained at the unselected word line Unselected WL during the read operation. However, an interference phenomenon in which the threshold voltage of the selected word line is increased due to a change of the threshold voltage of an adjacent word line may occur as the distance between the word lines becomes narrow. In this case, a second pass voltage Vpass2 higher than the first pass voltage Vpass1 may be applied to the unselected word line Unselected WL during the read operation. That is, by increasing the pass voltage applied to the unselected word line Unselected WL, the interference phenomenon between the word lines may be improved. However, when the pass voltage applied to the unselected word line Unselected WL is increased, a read disturbance phenomenon occurs.

Figure 8:
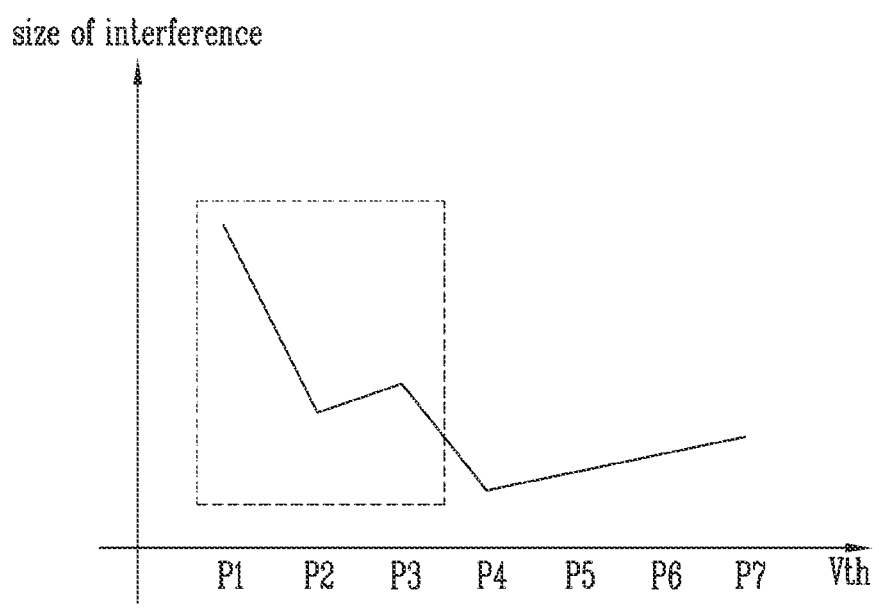
FIG. 8 is a diagram illustrating an interference phenomenon according to a program state.

FIG. 8 is a diagram illustrating the interference phenomenon according to the program state.

Referring to FIG. 8, a horizontal axis indicates the program state of the memory cells, and a vertical axis indicates a size of interference when the read voltage for determining the program state is applied to the selected word line.

As described above, as the distance between the word lines is decreased, the interference phenomenon may occur between the word lines.

At this time, as the threshold voltage corresponding to the program state is lower, the size of the interference may increase. For example, the size of the interference according to the first to third program states P1 to P3 is greater than the size of the interference according to the fourth to seventh program states P4 to P7. In this case, a method capable of improving the interference according to the first to third program states P1 to P3 is required.

For example, the reference voltage may be the fourth read voltage Vr4 having an intermediate magnitude among the plurality of read voltages Vr1 to Vr7. At this time, the lower program state may be a program state having a threshold voltage lower than the fourth read voltage Vr4. That is, the lower program state may be the first to third program states P1 to P3. In addition, the upper program state may be a program state having a threshold voltage higher than the fourth read voltage Vr4. That is, the upper program state may be the fourth to seventh program states P4 to P7.

Therefore, according to an embodiment of the present disclosure, when the read voltages for determining the lower program state are applied to the selected word line, the magnitude of the pass voltage applied to the unselected word line may be increased, thereby improving the read disturbance.

Figure 9:
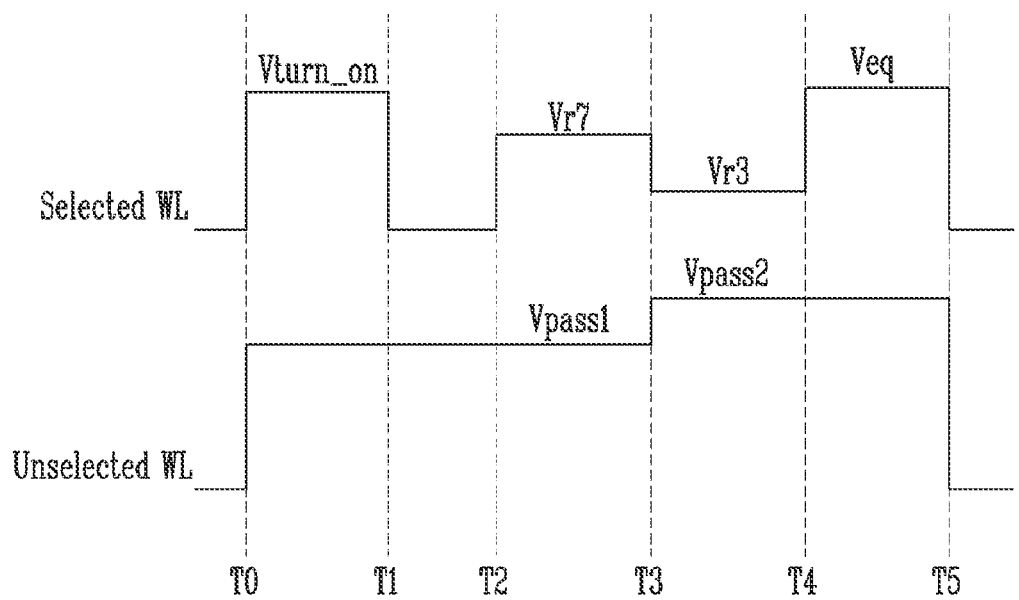
FIG. 9 is a waveform diagram illustrating an example of a read operation according to an embodiment of the present disclosure.

FIG. 9 is a waveform diagram illustrating an example of a read operation according to an embodiment of the present disclosure.

The read operation of FIG. 9 may be an operation for reading data stored in the LSB page.

Referring to FIG. 9, at T0, the read operation controller 131 may control the peripheral circuit 120 to apply the turn-on voltage Vturn_on to the selected word line Selected WL.

In addition, the read operation controller 131 may control the peripheral circuit 120 to apply the first pass voltage Vpass1 to the unselected word line Unselected WL.

At T1, as an embodiment, the ground voltage may be applied to the selected word line Selected WL. As another embodiment, a voltage different from the ground voltage may be applied to the selected word line.

At T2, the read operation controller 131 may control peripheral circuit 120 to apply the seventh read voltage Vr7 to the selected word line Selected WL. At this time, the seventh read voltage Vr7 may be a read voltage for determining the seventh program state P7 having a threshold voltage higher than the fourth read voltage Vr4 which is the reference voltage.

At this time, the first pass voltage Vpass1 applied to the unselected word line Unselected WL may be maintained.

At T3, the read operation controller 131 may control the peripheral circuit 120 to apply the third read voltage Vr3 to the selected word line Selected WL. At this time, the third read voltage Vr3 may be a read voltage for determining the third program state P3 having a threshold voltage lower than the fourth read voltage Vr4 which is the reference voltage.

At this time, the read operation controller 131 may control the peripheral circuit 120 to apply the second pass voltage Vpass2 higher than the first pass voltage Vpass1 to the unselected word line Unselected WL.

At T4, the read operation controller 131 may control the peripheral circuit 120 to apply the equalizing voltage Veq to the selected word line Selected WL.

At T5, the read operation controller 131 may control the peripheral circuit 120 to discharge the selected word line Selected WL and the unselected word lines Unselected WL.

Figure 10:
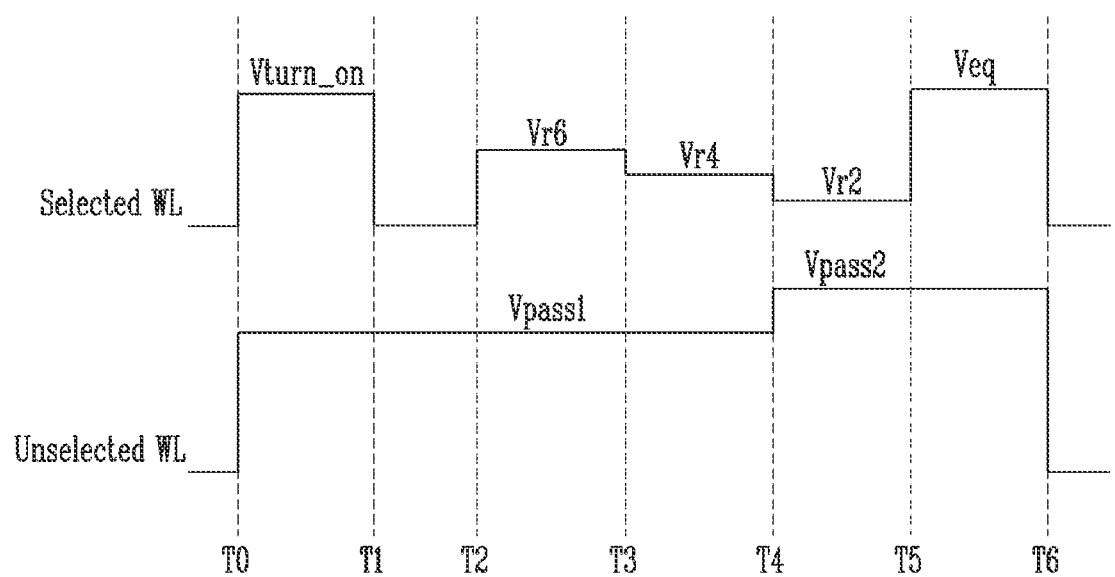
FIG. 10 is a waveform diagram illustrating another example of a read operation according to an embodiment of the present disclosure.

FIG. 10 is a waveform diagram illustrating another example of a read operation according to an embodiment of the present disclosure.

The read operation of FIG. 10 may be an operation for reading data stored in the CSB page.

Referring to FIG. 10, at T0, the read operation controller 131 may control the peripheral circuit 120 to apply the turn-on voltage Vturn_on to the selected word line Selected WL.

In addition, the read operation controller 131 may control the peripheral circuit 120 to apply the first pass voltage Vpass1 to the unselected word line Unselected WL.

At T1, as an embodiment, the ground voltage may be applied to the selected word line Selected WL. As another embodiment, a voltage different from the ground voltage may be applied to the selected word line.

At T2, the read operation controller 131 may control the peripheral circuit 120 to apply the sixth read voltage Vr6 to the selected word line Selected WL. At this time, the sixth read voltage Vr6 may be a read voltage for determining the sixth program state P6 having a threshold voltage higher than the fourth read voltage Vr4 which is the reference voltage.

At this time, the first pass voltage Vpass1 applied to the unselected word line Unselected WL may be maintained.

At T3, the read operation controller 131 may control the peripheral circuit 120 to apply the fourth read voltage Vr4 to the selected word line Selected WL. At this time, the fourth read voltage Vr4 may be a read voltage for determining the fourth program state P4 having a threshold voltage higher than the fourth read voltage Vr4 which is the reference voltage.

At this time, the first pass voltage Vpass1 applied to the unselected word line Unselected WL may be maintained.

At T4, the read operation controller 131 may control the peripheral circuit 120 to apply the second read voltage Vr2 to the selected word line Selected WL. At this time, the second read voltage Vr2 may be a read voltage for determining the second program state P2 having a threshold voltage lower than the fourth read voltage Vr4 which is the reference voltage.

At this time, the read operation controller 131 may control the peripheral circuit 120 to apply the second pass voltage Vpass2 higher than the first pass voltage Vpass1 to the unselected word line Unselected WL.

At T5, the read operation controller 131 may control the peripheral circuit 120 to apply the equalizing voltage Veq to the selected word line Selected WL.

At T6, the read operation controller 131 may control the peripheral circuit 120 to discharge the selected word line Selected WL and the unselected word lines Unselected WL.

Figure 11:
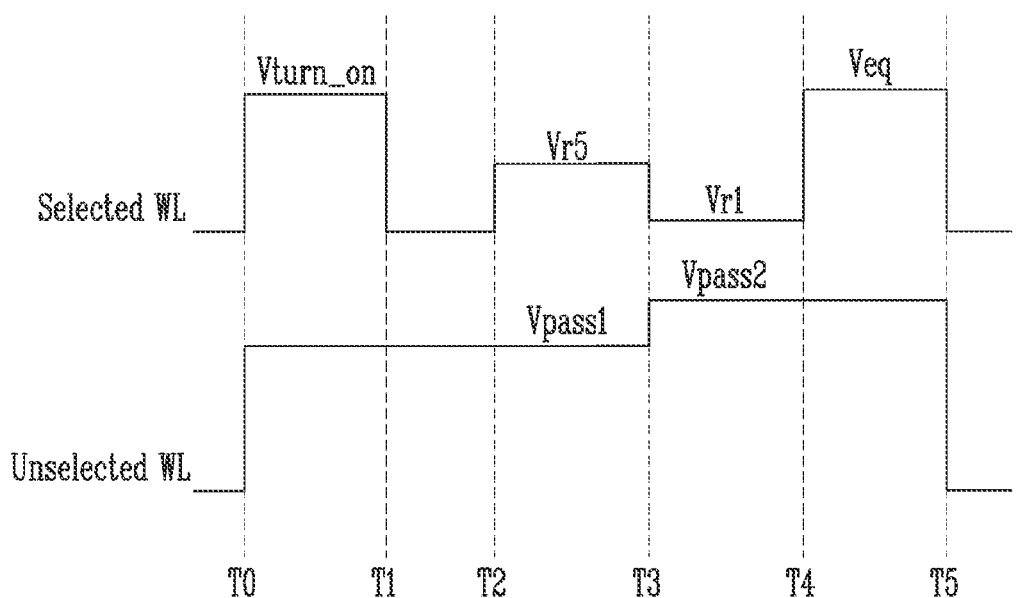
FIG. 11 is a waveform diagram illustrating still another example of a read operation according to an embodiment of the present disclosure.

FIG. 11 is a waveform diagram illustrating still another example of a read operation according to an embodiment of the present disclosure.

The read operation of FIG. 11 may be an operation for reading data stored in the MSB page.

Referring to FIG. 11, at T0, the read operation controller 131 may control the peripheral circuit 120 to apply the turn-on voltage Vturn_on to the selected word line Selected WL.

In addition, the read operation controller 131 may control the peripheral circuit 120 to apply the first pass voltage Vpass1 to the unselected word line Unselected WL.

At T1, as an embodiment, the ground voltage may be applied to the selected word line Selected WL. As another embodiment, a voltage different from the ground voltage may be applied to the selected word line.

At T2, the read operation controller 131 may control the peripheral circuit 120 to apply the fifth read voltage Vr5 to the selected word line Selected WL. At this time, the fifth read voltage Vr5 may be a read voltage for determining the fifth program state P5 having a threshold voltage higher than the fourth read voltage Vr4 which is the reference voltage.

At this time, the first pass voltage Vpass1 applied to the unselected word line Unselected WL may be maintained.

At T3, the read operation controller 131 may control the peripheral circuit 120 to apply the first read voltage Vr1 to the selected word line Selected WL. At this time, the first read voltage Vr1 may be a read voltage for determining the first program state P1 having a threshold voltage lower than the fourth read voltage Vr4 which is the reference voltage.

At this time, the read operation controller 131 may control the peripheral circuit 120 to apply the second pass voltage Vpass2 higher than the first pass voltage Vpass1 to the unselected word line Unselected WL.

At T4, the read operation controller 131 may control the peripheral circuit 120 to apply the equalizing voltage Veq to the selected word line Selected WL.

At T5, the read operation controller 131 may control the peripheral circuit 120 to discharge the selected word line Selected WL and the unselected word lines Unselected WL.

Figure 12:
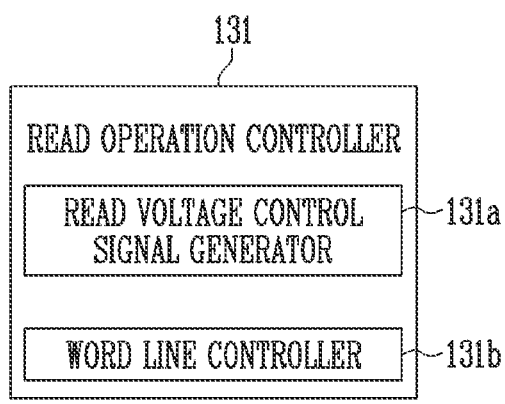
FIG. 12 is a diagram illustrating a read operation controller according to an embodiment of the present disclosure.

FIG. 12 is a diagram illustrating a read operation controller 131 according to an embodiment of the present disclosure.

The read operation controller 131 of FIG. 12 may indicate the read operation controller 131 of FIGS. 1 and 2.

Referring to FIG. 12, the read operation controller 131 may include a read voltage control signal generator 131a and a word line controller 131b.

The read voltage control signal generator 131a may generate a read voltage control signal instructing to generate the plurality of voltages used for the read operation. The read voltage control signal may be transmitted to the voltage generator 122, and the voltage generator 122 may generate the plurality of read voltages, the first pass voltage, the second pass voltage, and the like according to the read voltage control signal.

The word line controller 131b may control a voltage applied to the plurality of word lines.

For example, the word line controller 131b may control the peripheral circuit 120 to apply any one of the plurality of read voltages to the selected word line. In addition, the word line controller 131b may control the peripheral circuit 120 to apply the first pass voltage to the unselected word line while the first read voltage is applied to the selected word line. In addition, the word line controller 131b may control the peripheral circuit 120 to apply the second pass voltage to the unselected word line while the second read voltage is applied to the selected word line.

Figure 13:
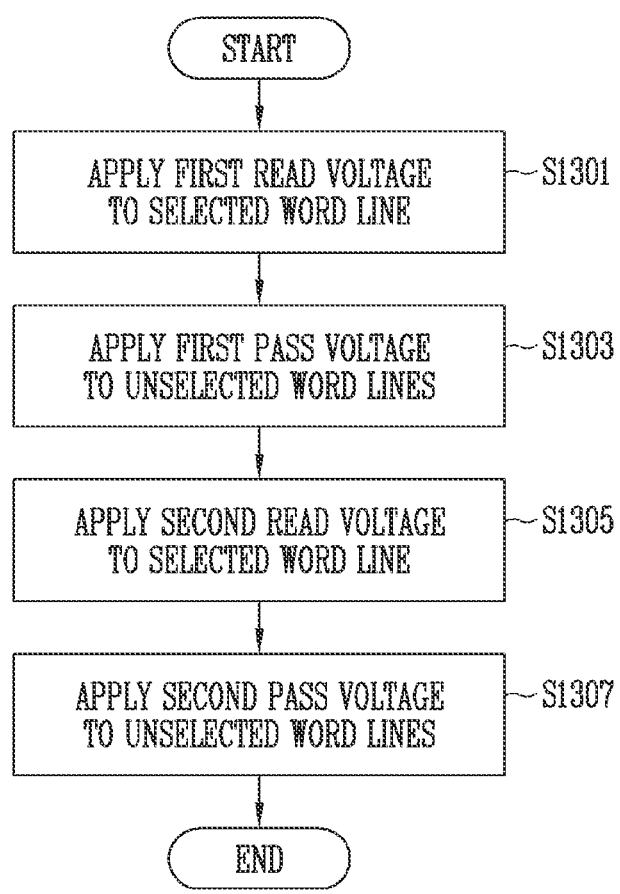
FIG. 13 is a flowchart illustrating a method of operating a memory device according to an embodiment of the present disclosure.

FIG. 13 is a flowchart illustrating a method of operating a memory device according to an embodiment of the present disclosure.

The method shown in FIG. 13 may be performed, for example, by the read operation controller 131 shown in FIG. 12.

Referring to FIG. 13, in step S1301, the read operation controller 131 may apply the first read voltage to the selected word line. At this time, the first read voltage may be the read voltage for determining the program state of the memory cells having the threshold voltage higher than the reference voltage among the plurality of read voltages.

In step S1303, the read operation controller 131 may apply the first pass voltage to the unselected word lines.

In step S1305, the read operation controller 131 may apply the second read voltage to the selected word line. At this time, the second read voltage may be the read voltage for determining the program state of the memory cells having the threshold voltage lower than the reference voltage among the plurality of read voltages.

In step S1307, the read operation controller 131 may apply the second pass voltage higher than the first pass voltage to the unselected word lines.

Figure 14:
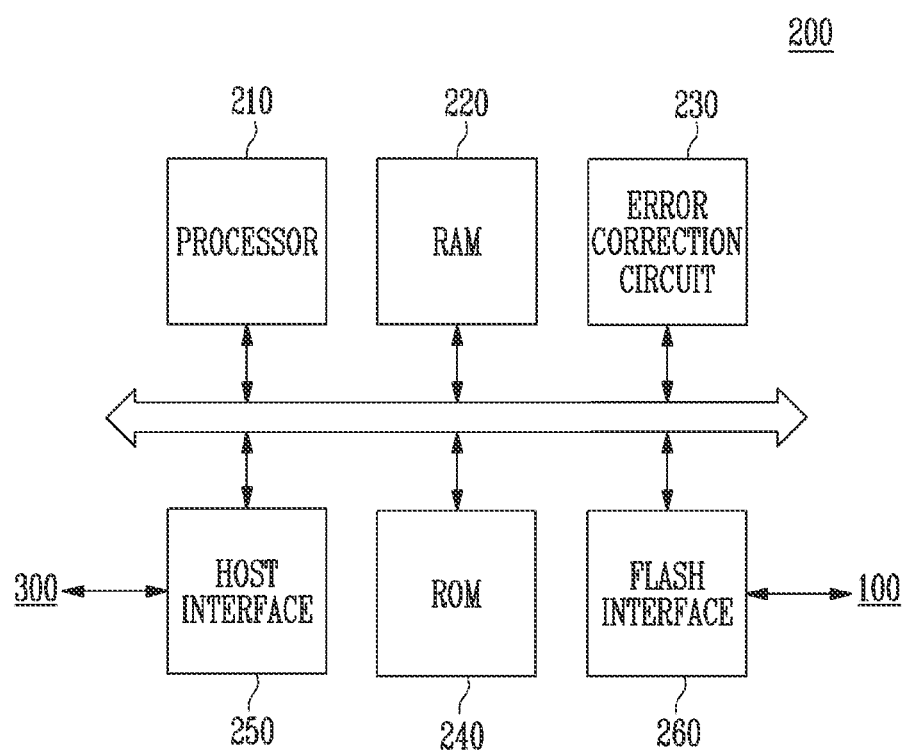
FIG. 14 is a diagram illustrating a memory controller of FIG. 1.

FIG. 14 is a diagram illustrating the memory controller of FIG. 1.

Referring to FIGS. 1 and 14, the memory controller 200 may include a processor 210, a RAM 220, an error correction circuit 230, a ROM 240, a host interface 250, and a flash interface 260.

The processor 210 may control an overall operation of the memory controller 200. The RAM 220 may be used as a buffer memory, a cache memory, an operation memory, and the like of the memory controller 200.

The error correction circuit 230 may perform error correction. The error correction circuit 230 may perform error correction encoding (ECC encoding) based on data to be written to the memory device 100 through the flash interface 260. The error correction encoded data may be transferred to the memory device 100 through the flash interface 260. The error correction circuit 230 may perform error correction decoding (ECC decoding) on data received from the memory device 100 through the flash interface 260. For example, the error correction circuit 230 may be included in the flash interface 260 as a component of the flash interface 260.

The ROM 240 may store various information required for the memory controller 200 to operate in a firmware form.

The memory controller 200 may communicate with an external device (for example, the host 300, an application processor, and the like) through the host interface 250.

The memory controller 200 may communicate with the memory device 100 through the flash interface 260. The memory controller 200 may transmit a command, an address, a control signal, and the like to the memory device 100 and receive data through the flash interface 260. For example, the flash interface 260 may include a NAND interface.

Figure 15:
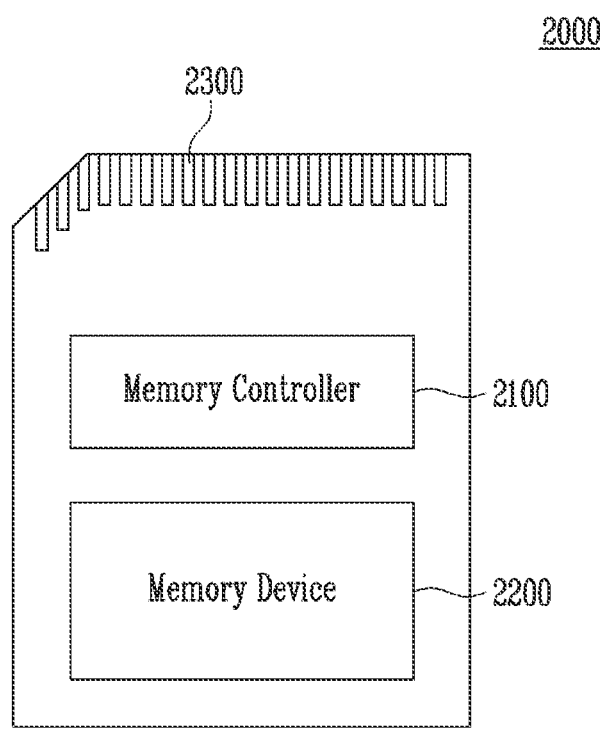
FIG. 15 is a block diagram illustrating a memory card system to which a storage device according to an embodiment of the present disclosure is applied.

FIG. 15 is a block diagram illustrating a memory card system to which a storage device according to an embodiment of the present disclosure is applied.

Referring to FIG. 15, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 may be configured to control read, write, erase, and background operations of the memory device 2200. The memory controller 2100 is configured to provide an interface between the memory device 2200 and a host. The memory controller 2100 is configured to drive firmware for controlling the memory device 2200. The memory controller 2100 may be implemented equally to the memory controller 200 described with reference to FIG. 1. The memory device 2200 may be implemented identically to the memory device 100 described with reference to FIG. 1.

For example, the memory controller 2100 may include components such as a random access memory (RAM), a processor, a host interface, a memory interface, and an error corrector.

The memory controller 2100 may communicate with an external device through the connector 2300. The memory controller 2100 may communicate with an external device (for example, the host) according to a specific communication standard. For example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. For example, the connector 2300 may be defined by at least one of the various communication standards described above.

For example, the memory device 2200 may be configured of various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

Figure 16:
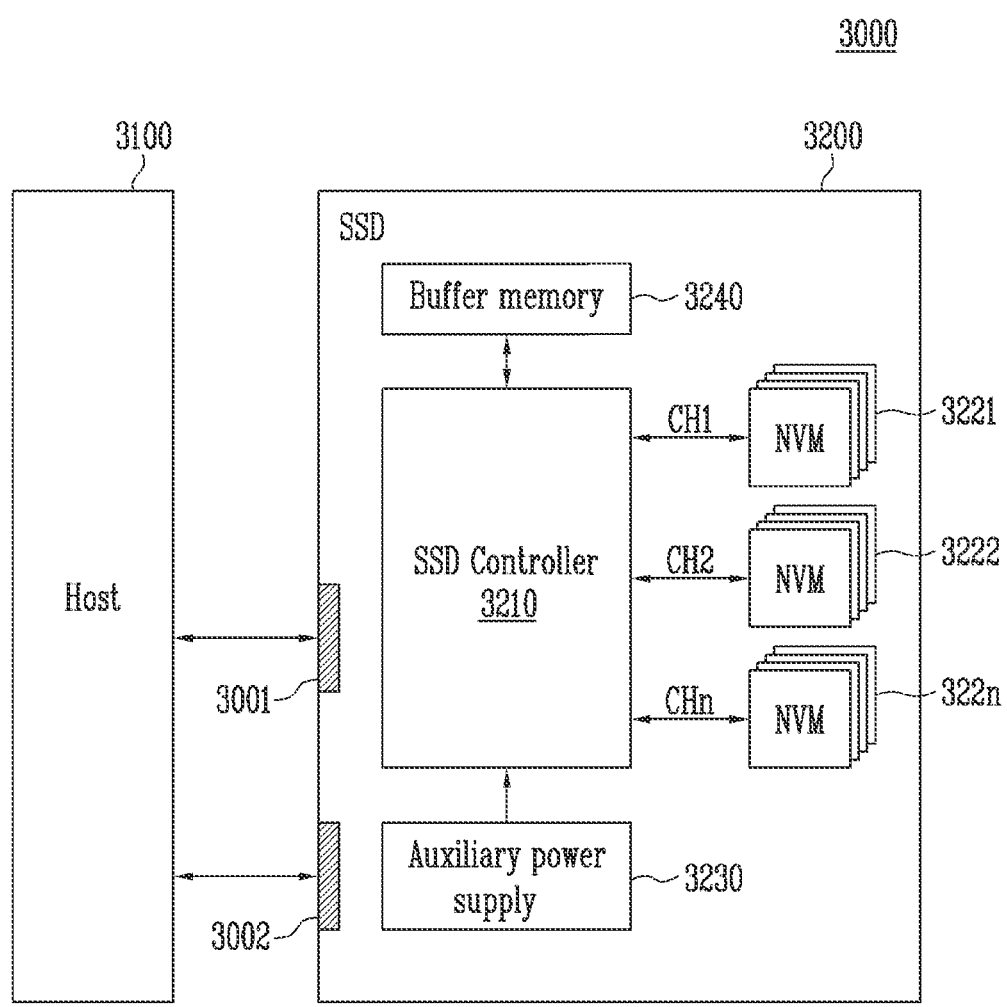
FIG. 16 is a block diagram illustrating a solid state drive (SSD) system to which a storage device according to an embodiment of the present disclosure is applied.

FIG. 16 is a block diagram illustrating a solid state drive (SSD) system to which a storage device according to an embodiment of the present disclosure is applied.

Referring to FIG. 16, the SSD system 3000 includes a host 3100 and an SSD 3200. The SSD 3200 exchanges a signal with the host 3100 through a signal connector 3001 and receives power through a power connector 3002. The SSD 3200 includes an SSD controller 3210, a plurality of flash memories 3221 to 322n, an auxiliary power device 3230, and a buffer memory 3240.

According to an embodiment of the present disclosure, the SSD controller 3210 may perform the function of the memory controller 200 described with reference to FIG. 1.

The SSD controller 3210 may control the plurality of flash memories 3221 to 322n in response to the signal received from the host 3100. For example, the signal may be signals based on an interface between the host 3100 and the SSD 3200. For example, the signal may be a signal defined by at least one of interfaces such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power from the host 3100 and may charge the power. The auxiliary power device 3230 may provide power of the SSD 3200 when power supply from the host 3100 is not smooth. For example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store meta data (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

Figure 17:
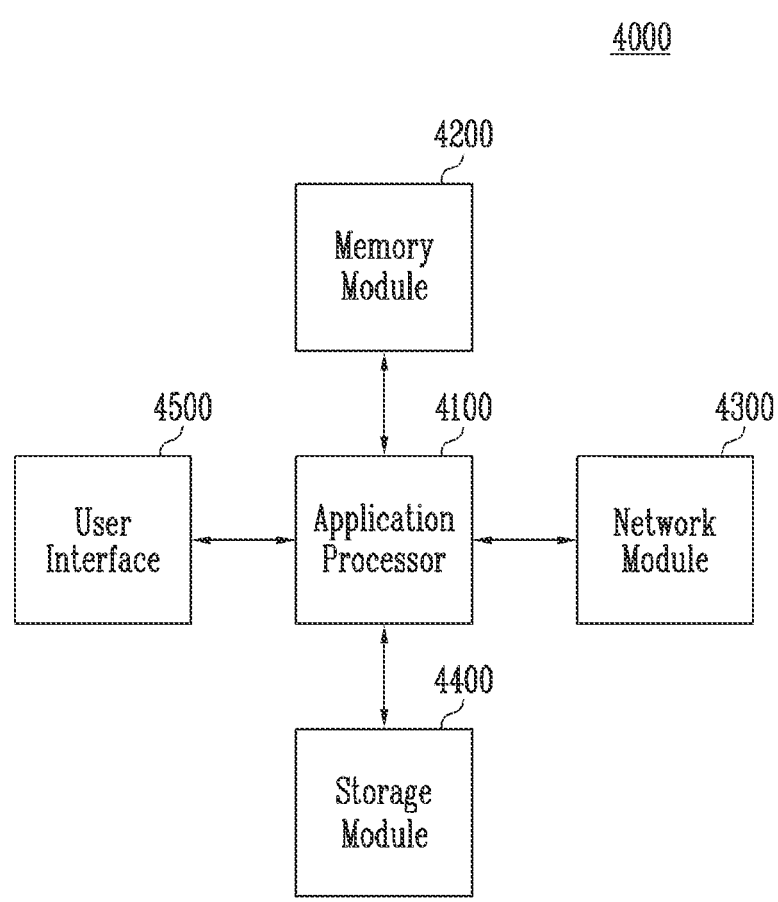
FIG. 17 is a block diagram illustrating a user system to which a storage device according to an embodiment of the present disclosure is applied.

FIG. 17 is a block diagram illustrating a user system to which a storage device according to an embodiment of the present disclosure is applied.

Referring to FIG. 17, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and Wi-Fi. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device 100 described with reference to FIG. 1. The storage module 4400 may operate identically to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

What is claimed is:

1. A method of operating a memory device, the method comprising:
 applying any one of a plurality of read voltages to a selected word line;
 applying a first pass voltage to unselected word lines while a first read voltage for determining a program state of memory cells having a threshold voltage higher than a reference voltage among the plurality of read voltages is applied to the selected word line; and
 applying a second pass voltage higher than the first pass voltage to the unselected word lines while a second read voltage for determining a program state of memory cells having a threshold voltage lower than the reference voltage among the plurality of read voltages is applied to the selected word line.

2. The method of claim 1, wherein the reference voltage is a read voltage having an intermediate magnitude among the plurality of read voltages.

3. The method of claim 1, wherein the first read voltage is higher than the second read voltage.

4. The method of claim 1, wherein the plurality of read voltages are used to determine the program states of the memory cells based on the threshold voltages of the memory cells.

5. The method of claim 1, wherein the second read voltage lower than the first read voltage is applied to the selected word line before the first read voltage is applied to the selected word line.

6. The method of claim 1, wherein the first read voltage higher than the second read voltage is applied to the selected word line before the second read voltage is applied to the selected word line.

7. The method of claim 1, wherein the reference voltage has an intermediate magnitude between a lowest read voltage and a greatest read voltage.

8. The method of claim 1, wherein the reference voltage is a voltage that becomes a reference for dividing the program states of the memory cells into two groups.

9. The method of claim 1, further comprising:
applying a turn-on voltage higher than the plurality of read voltages to the selected word line before the any one of the plurality of read voltages is applied to the selected word line.

* * * * *